(12) United States Patent
Sharma et al.

(10) Patent No.: US 7,361,531 B2
(45) Date of Patent: Apr. 22, 2008

(54) METHODS AND APPARATUS FOR FLIP-CHIP-ON-LEAD SEMICONDUCTOR PACKAGE

(75) Inventors: Nirmal Sharma, Shrewsbury, MA (US); Virgil Ararao, Rutland, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 119 days.

(21) Appl. No.: 11/265,801

(22) Filed: Nov. 1, 2005

(65) Prior Publication Data

US 2007/0099348 A1    May 3, 2007

(51) Int. Cl.
H01L 21/44 (2006.01)
H01L 21/50 (2006.01)
H01L 23/495 (2006.01)

(52) U.S. Cl. .................. 438/111; 438/123; 257/673; 257/E21.506; 257/E23.047; 257/E23.054

(58) Field of Classification Search ............ 438/110, 438/111, 121, 123, 124, 127; 257/E21.499, 257/E21.502, E21.506, E21.507, E21.509, 257/E21.51, E23.031, E23.039, E23.047, 257/E23.052, E23.054, E23.116
See application file for complete search history.

(56) References Cited

U.S. PATENT DOCUMENTS

| | | | |
|---|---|---|---|
| 4,210,926 A | 7/1980 | Hacke | |
| 5,612,259 A * | 3/1997 | Okutomo et al. ............. 29/827 |
| 5,817,540 A | 10/1998 | Wark | |
| 6,388,336 B1 * | 5/2002 | Venkateshwaran et al. . 257/779 |
| 6,482,680 B1 | 11/2002 | Khor et al. | |
| 6,593,545 B1 | 7/2003 | Greenwood et al. | |
| 6,798,044 B2 | 9/2004 | Joshi | |
| 6,828,220 B2 | 12/2004 | Pendse et al. | |
| 7,148,086 B2 * | 12/2006 | Shim et al. ................. 438/123 |
| 7,221,045 B2 * | 5/2007 | Park et al. ................... 257/676 |
| 2003/0230792 A1 | 12/2003 | Wu et al. | |
| 2004/0038452 A1* | 2/2004 | Pu .............................. 438/116 |
| 2005/0194676 A1* | 9/2005 | Fukuda et al. .............. 257/698 |
| 2005/0266611 A1* | 12/2005 | Tu et al. ..................... 438/108 |

OTHER PUBLICATIONS

PCT Invitation to Pay Additional Fees From the ISA, International Application No. PCT/US2006/041580 (Form PCT/ISA/206).
PCT Search Report and Written Opinion of the ISA for PCT/US2006/041580, dated May 30, 2007.

* cited by examiner

*Primary Examiner*—Scott B. Geyer
(74) *Attorney, Agent, or Firm*—Daly, Crowley, Mofford & Durkee, LLP

(57) ABSTRACT

Fabrication of a semiconductor package includes placing a conductive material on a protrusion from a leadframe to form a first assembly, forming a non-conductive mask about the protrusion, and placing a die on the first assembly, the die having an active area. Fabrication can further include reflowing the conductive material to form a second assembly such that a connection extends from the die active area, through the conductive material, to the protrusion. A semiconductor package includes a leadframe having a protrusion, a conductive material reflowed to the protrusion, and a die having an active area coupled to the protrusion by the reflowed solder.

19 Claims, 8 Drawing Sheets

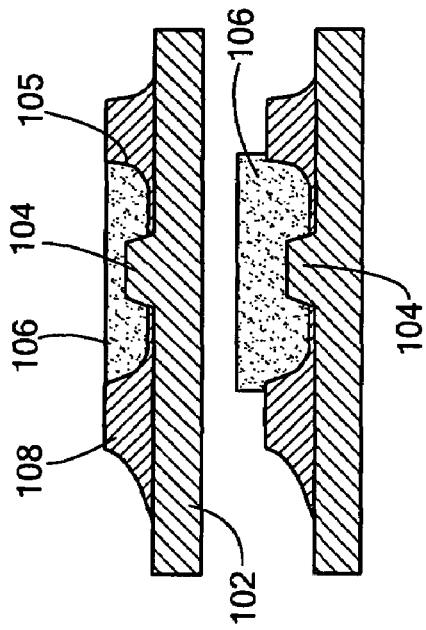
Screen Printing Or Dispensing →
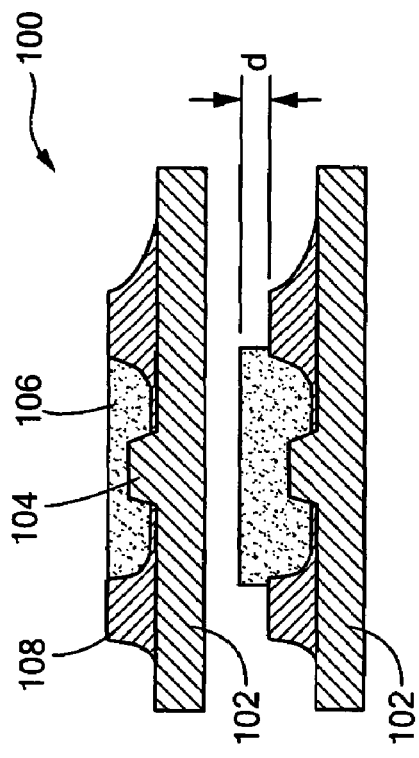
FIG. 1A
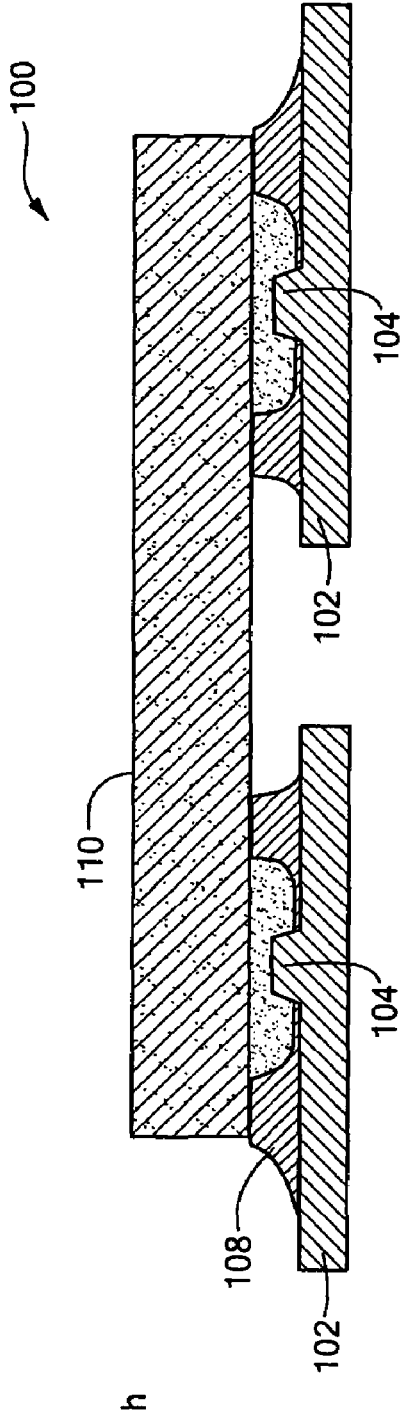
Chip attach →
FIG. 1B

Screen Printing Or Dispensing →

Chip attach →

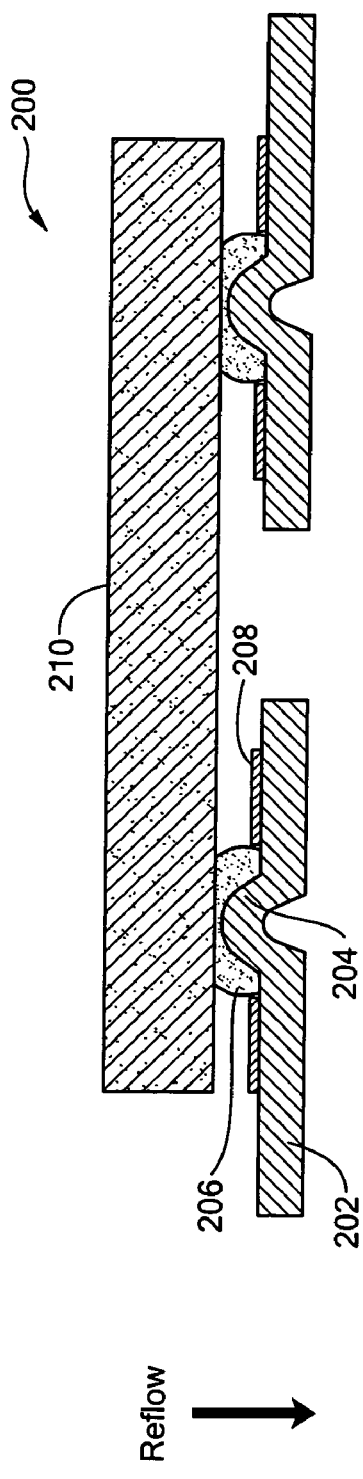
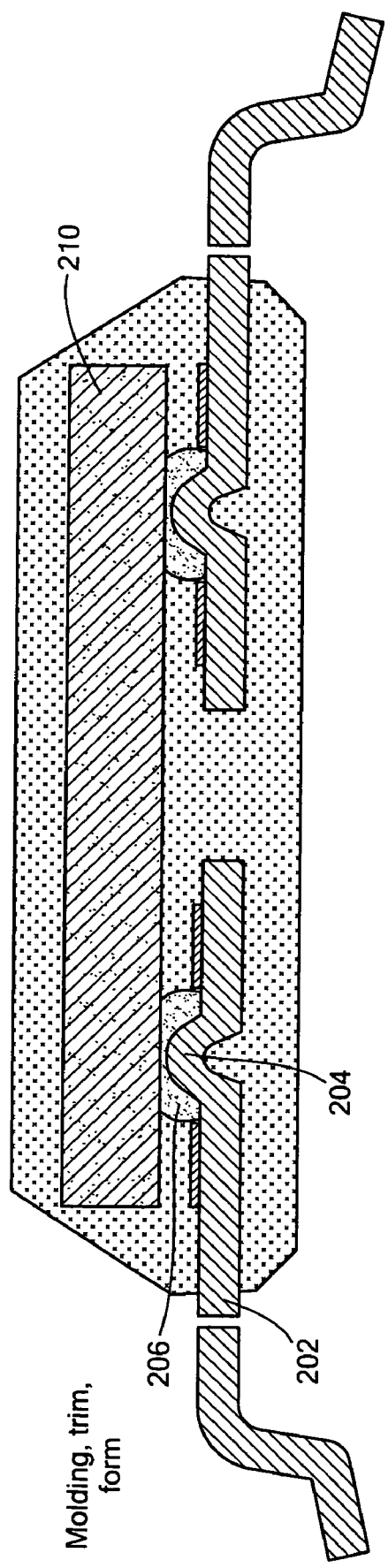

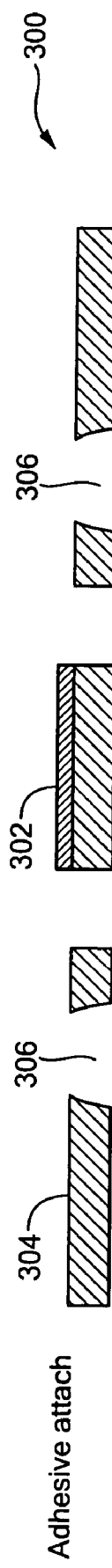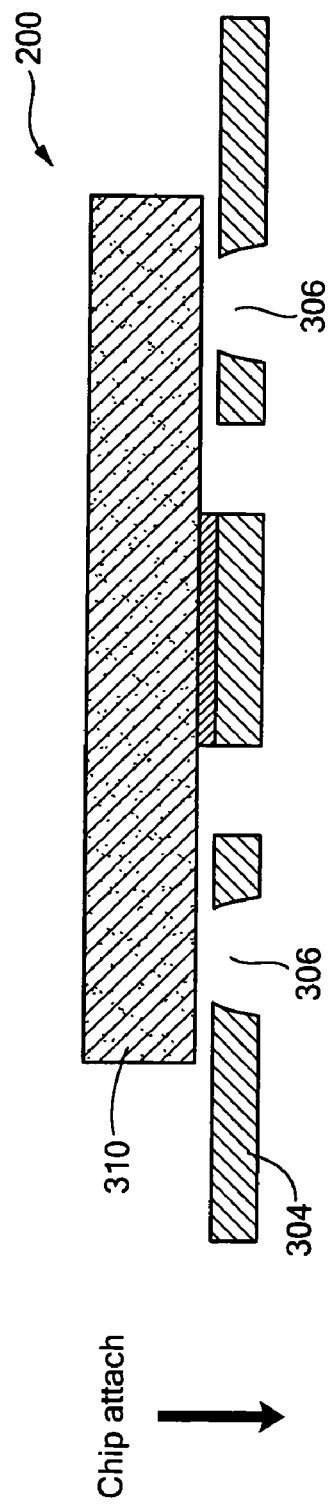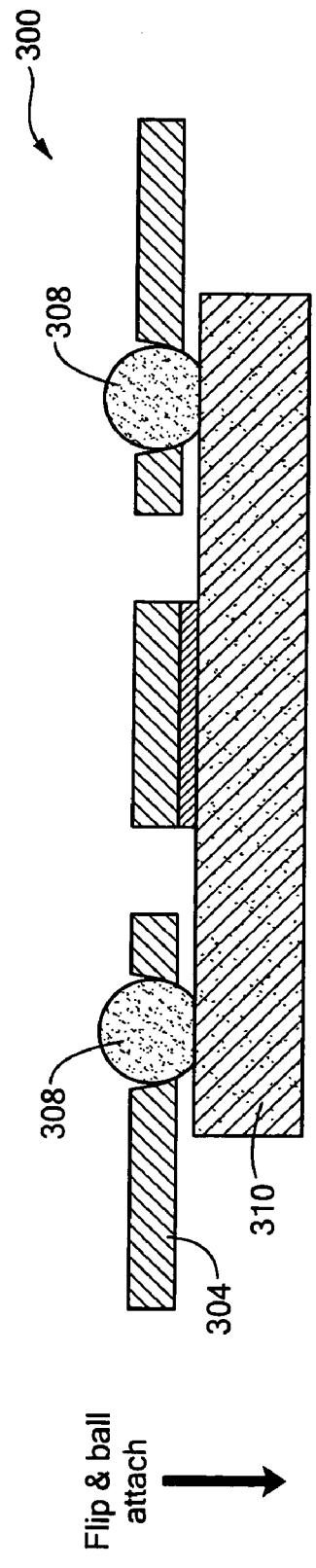

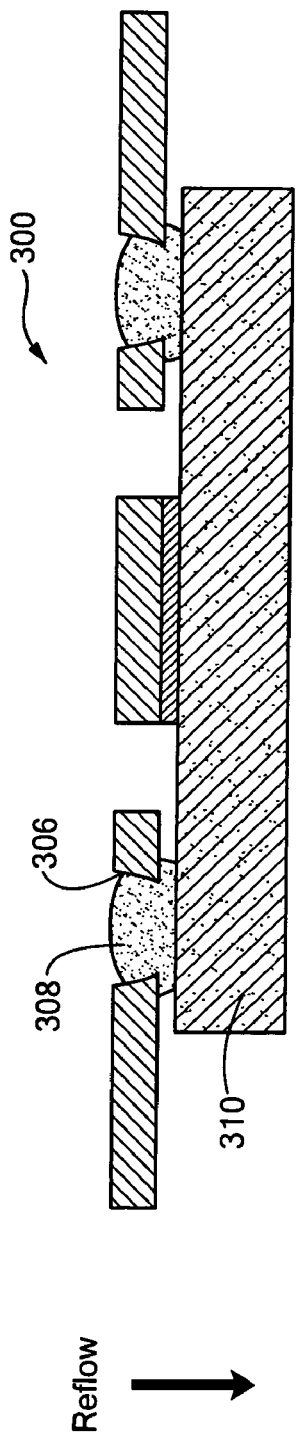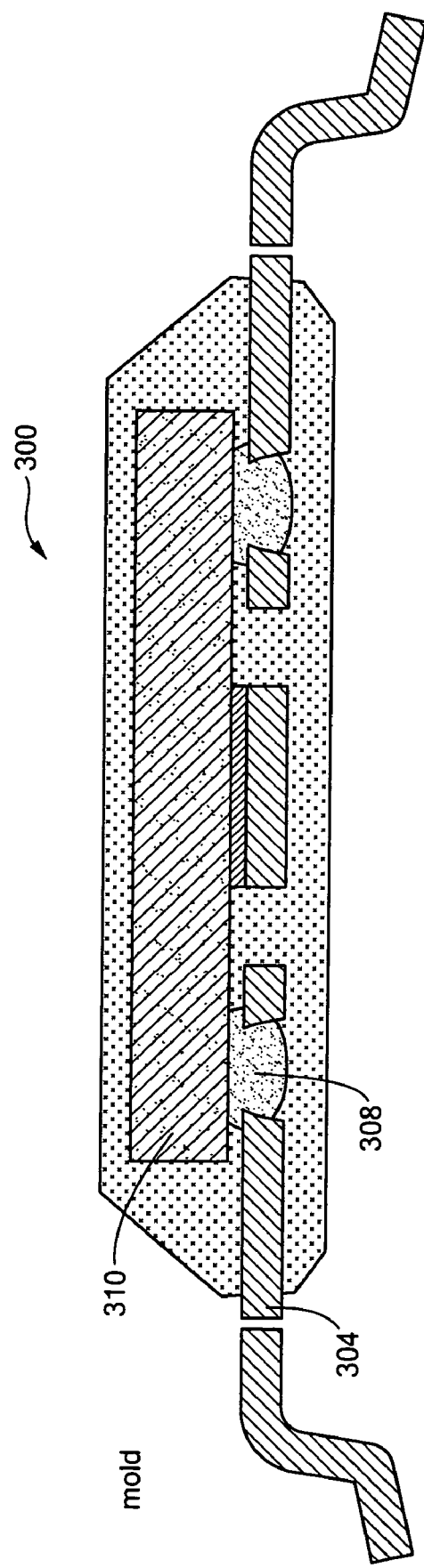

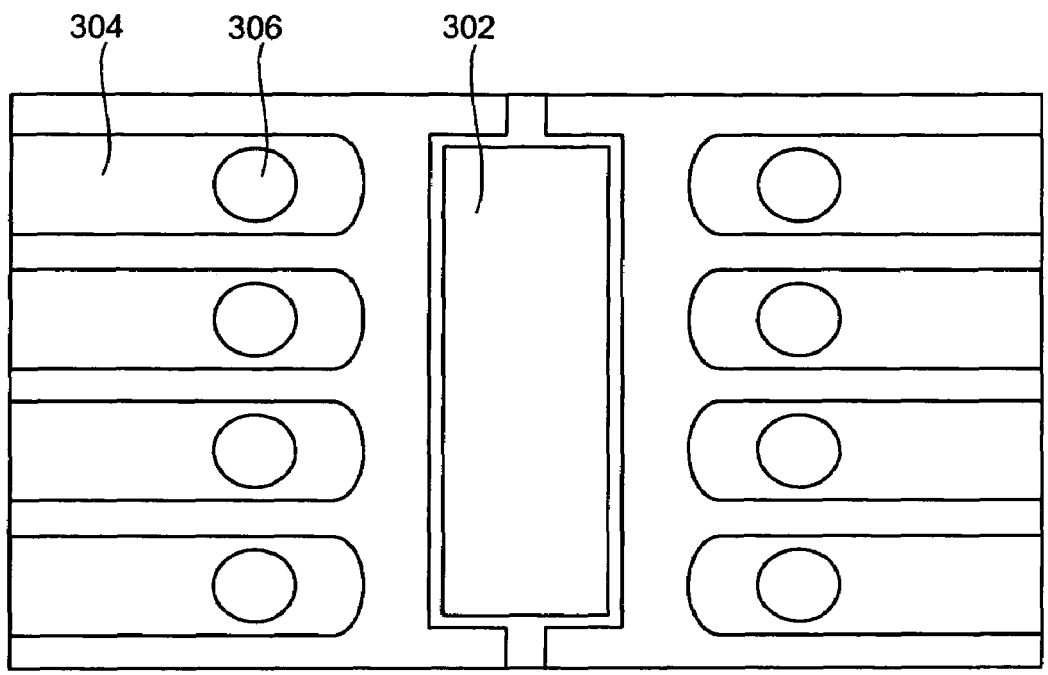
FIG. 3A1
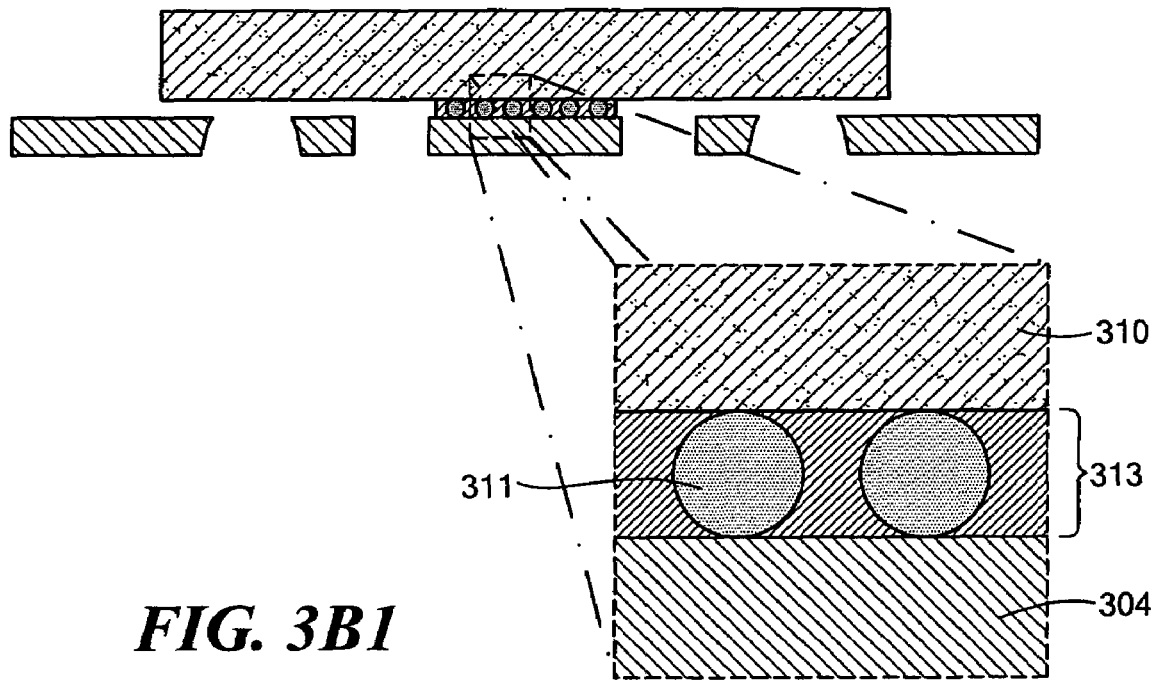
FIG. 3B1

METHODS AND APPARATUS FOR FLIP-CHIP-ON-LEAD SEMICONDUCTOR PACKAGE

CROSS REFERENCE TO RELATED APPLICATIONS

Not Applicable.

STATEMENT REGARDING FEDERALLY SPONSORED RESEARCH

Not Applicable.

BACKGROUND

As is known in the art, conventional Flip-Chip-On-Leadframe (FLOC) techniques require so-called wafer bumping as an intermediate step between wafer fabrication and leadframe attachment for semiconductor packages. Wafer bumping adds significant cost and delay to the assembly process.

U.S. Pat. No. 5,817,540 to Wark discloses a method of fabricating FLOC devices and fabricating assemblies. Wark teaches depositing solder on a lead frame by means of dispensing and screen printing and attaching to a bumped wafer with solder reflow. Aside from solder material at lead frame, Wark requires using conductive epoxy, such as silver filled epoxy, for solder bump attachment.

U.S. Pat. No. 6,482,680 to Khor et al. discloses a FCOL technique requiring dispensing or printing solder on a lead frame, attaching a bump die, and reflowing the solder. Khor teaches the use of a lower temperature melting point solder on the lead frame side than the die bump side, or vice-versa.

U.S. Pat. No. 6,798,044 to Joshi discloses a conventional method of attachment, such as putting a solder ball or paste on a lead frame, chip attachment, and reflow. Joshi teaches a chip arrangement in which one chip is a controller integrated circuit and the backside of the second chip serves as a drain contact for a MOSFET. Joshi also teaches that the melting point of one bump (flip chip die) is higher (310° C.) than the other (250° C.).

U.S. Pat. No. 6,828,220 to Pendse et al. discloses a FCOL package and process that includes forming a gold studbumping on a die. The attachment method to the lead frame is thermo-compression.

While the known techniques above may provide some improvement in the art, each requires bumping the die thereby limiting the current-carrying capacity of a bump and also adding significant cost and delay to the assembly process due to the required wafer bumping.

SUMMARY

The present invention provides methods and apparatus to provide a die leadframe connection that eliminates the need for conventional wafer bumping. With this arrangement, semiconductor package assembly is more cost efficient and timely. While the invention is primarily shown and described in conjunction with silicon wafers and dies and certain exemplary fabrication techniques, it is understood that the invention is applicable to semiconductor materials and techniques in general relating to fabricating devices.

In one aspect of the invention, a method includes placing a conductive material, such as solder paste, on a protrusion from a leadframe to form a first assembly, forming a non-conductive mask about the protrusion, and placing a die, which has an active area, on the first assembly. The method can further include reflowing the conductive material to raise up the die to form a second assembly such that a connection extends from the die active area, through the conductive material, to the protrusion. The method can further including surrounding the die with a material to form a third assembly, such as by molding.

The method can include one or more further features, such as forming a depression in the mask, placing the conductive material in the depression, wherein the protrusion extends into the depression, filling gaps about the reflowed conductive material with an epoxy compound, forming an under bump metallization structure at the active area of the die, and forming a redistribution layer on the die to form a connection point for the active area.

In one embodiment of the invention, a method includes placing a mask on a lead frame having a protrusion, the mask having a depression into which the protrusion extends, placing solder paste in the depression to form a first assembly, placing a die on the first assembly, the die having an active area, and reflowing the solder paste to raise up the die. The method can further include securing the die to the leadframe such that the solder forms a connection between the protrusion and the active area of the die.

The method can further include one or more of preparing the active area of the die to provide an under bump metallization structure, molding a package to hold the die and leadframe, filling gaps adjacent the reflowed solder with epoxy, forming the protrusion from the leadframe, and extending the solder paste above the depression.

In another aspect of the invention, a method includes placing adhesive on a leadframe having a through hole, attaching a die to the adhesive, the die having an active area, placing a solder ball in the through hole, and reflowing the solder ball to form a connection between the active area and the leadframe. The method can further include forming an under bump metallization layer at the active area of the die and forming a redistribution layer on the die.

In a further aspect of the invention, a semiconductor package includes a leadframe having a protrusion, a conductive material reflowed to the protrusion, a die having an active area coupled to the protrusion by the reflowed solder, a material about the conductive material to secure the die to the leadframe, and an under bump metallization structure on active area of the die.

The semiconductor package can further include a conductive mask having a depression into which the protrusion extends, wherein the conductive material includes solder paste that raised up the die when reflowed.

In another aspect of the invention, a device includes a semiconductor package, including a leadframe having a protrusion, a conductive material reflowed to the protrusion, a die having an active area coupled to the protrusion by the reflowed solder, a material about the conductive material to secure the die to the leadframe, and an under bump metallization structure on active area of the die.

Exemplary device applications include, without limitation, power interface drivers, automotive power and signal processing integrated circuits, safety and security integrated circuits, and power management.

BRIEF DESCRIPTION OF THE DRAWINGS

The exemplary embodiments contained herein will be more fully understood from the following detailed description taken in conjunction with the accompanying drawings, in which:

FIGS. 1A-D show a schematic depiction of a process to form a FCOL package in accordance with the present invention;

FIGS. 2A-D show a schematic depiction of a further process to form a FCOL package in accordance with the present invention;

FIGS. 3A-E show a schematic depiction of another process to form a FCOL package in accordance with the present invention;

FIG. 3A1 shows a top view of a lead frame that can be used in process shown in FIGS. 3A-E;

FIG. 3B1 shows a detailed view of a portion of an assembly formed in the process shown in FIGS. 3A-E;

DETAILED DESCRIPTION

In general, the present invention provides methods and apparatus directed to forming a Flip-Chip-Can-Leadframe (FCOL) package. The inventive FCOL optimizes the electrical performance and reliability of input/outputs (i.e., bumps) by increasing the Under Bump Metallization (UBM). With this arrangement, significant cost savings and efficiencies are achieved due to the elimination of wafer bumping.

Before describing the invention in detail below some terminology is discussed. As is known in art, silicon wafers are produced and processed so that a number of die can be cut from the wafer. One or more die can be used as the basis for a semiconductor chip or package that can be placed on a printed circuit board as a component.

Figure 1C:
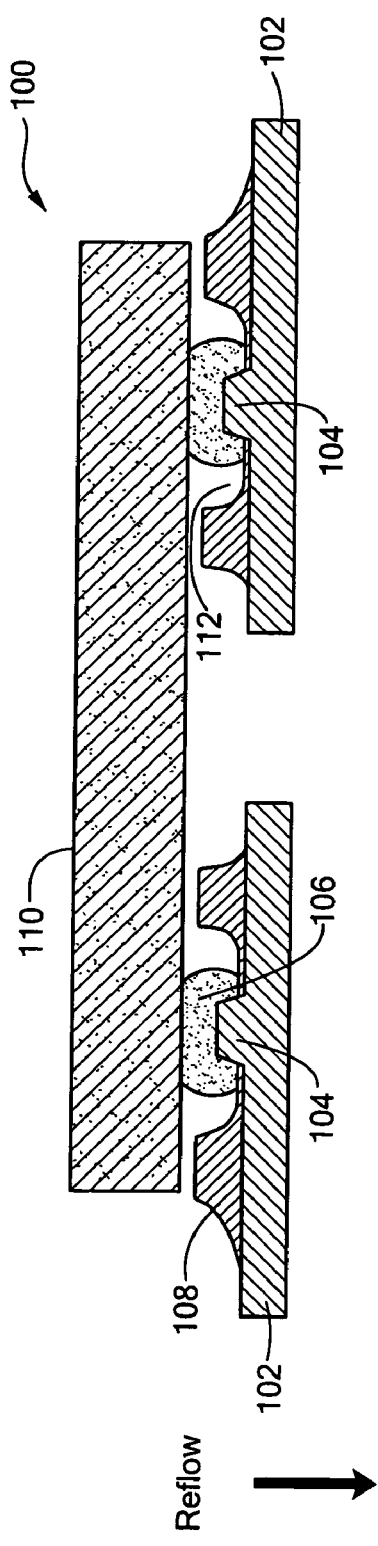

FIGS. 1A-D show an exemplary sequence 100 to implement one embodiment of Flip-Chip-On-Lead semiconductor package assembly in accordance with the present invention. As shown in FIG. 1A, a lead frame 102 includes a protrusion shown as a pad pillar 104 extending into a depression 105, which can be like a bowl, filled with solder paste 106. The lead frame 102 forms a bottom of the bowl and a solder mask 108, or other deposited material, forms sides of the bowl. In one embodiment, the solder paste 106 extends a distance d above a rim of the bowl.

In an exemplary embodiment, the solder paste 106 is dispensed into the depression. Alternatively, the solder paste 106 is deposited, such as by screen printing, with distance d corresponding to a stencil thickness.

In general, the lead frame includes a protrusion 104 extending into the depression (bowl) 105 formed in the mask. It is understood that the depression 105 can have any type of geometry suitable to hold reflowed solder. It is also understood that the protrusion 104 can have any geometry that extends into the depression to provide a suitable connection with the solder.

Figure 1D:
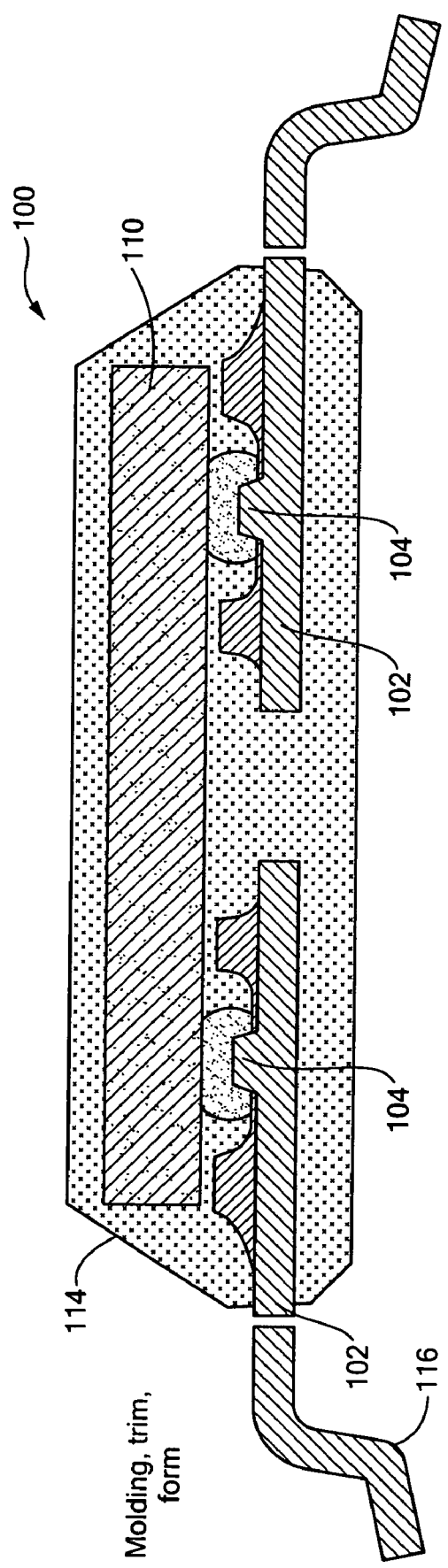

As shown in FIG. 1B, a silicon chip, i.e., die, 110 rests on the mask 108/solder paste 106. The assembly is then treated to reflow the solder paste 106, which raises the die 110 up due to surface tension of the reflowed solder, as shown in FIG. 1C. By lifting up the die 110, a gap 112 is created that can be filled by epoxy molding compound EMC, for example. Suitable EMCs will be readily apparent to one of ordinary skill in the art. In FIG. 1D, the assembly is surrounded by a material 114, such as plastic, to provide the semiconductor package with I/O pins 116.

It is understood a variety of well-known processes can be used for certain steps of the assembly. For example, screen printing, dispensing and solder ball attachment can be used. In addition, the solder paste can be Pb-based or Pb-free. However, it is contemplated that suitable conductive materials other than solder may be used.

FIGS. 2A-D shows another assembly process 200 having some similarity with process 100 of FIGS. 1A-D. In process 200, the pad pillar 204 has an arcuate surface that extends from the lead frame 202. This geometry for the pad pillar 204 can be formed using a variety of well known processes including stamping and coining.

Figure 2A:
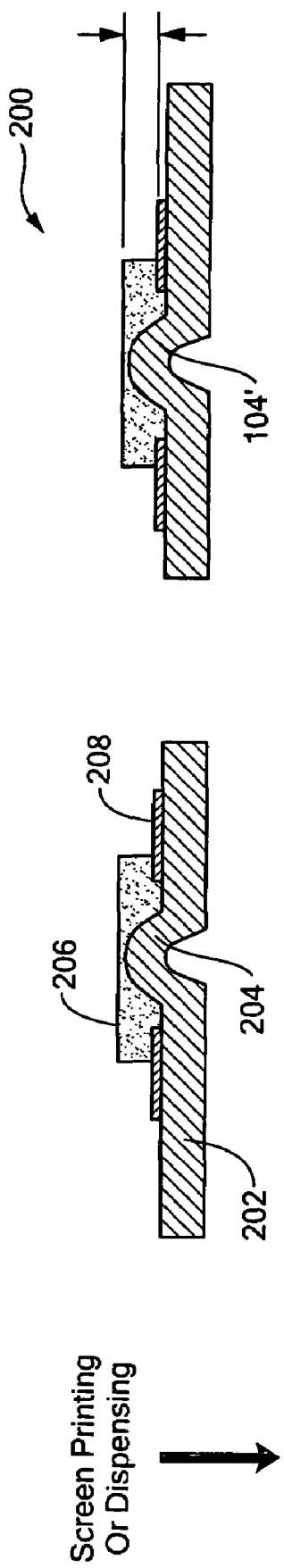
Figure 2B:
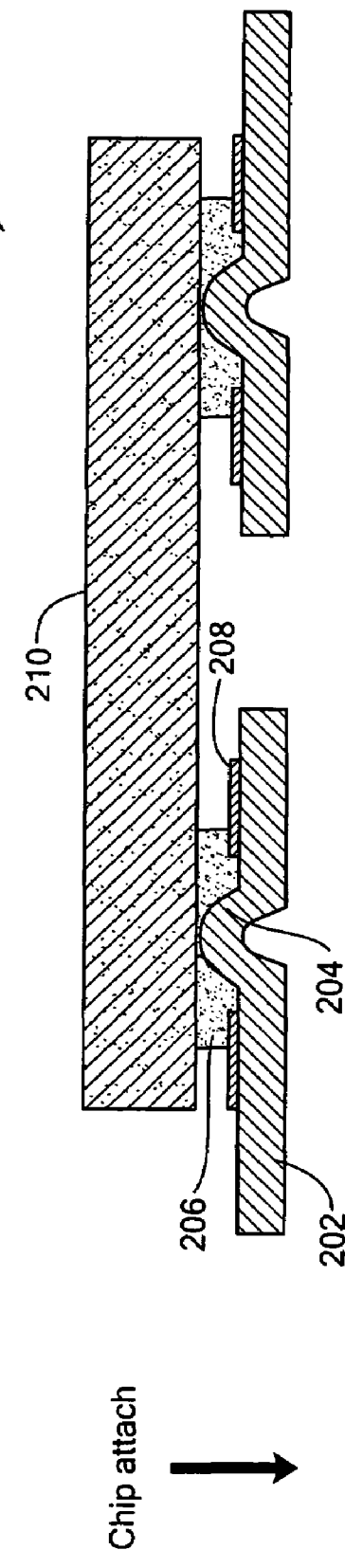

In FIG. 2A, solder paste 206 covers the pad pillar 204 and possible part of a solder mask 208 formed on the lead frame 202. The die 210 is placed on the solder paste 206, as shown in FIG. 2B, and the solder is reflowed, as shown in FIG. 2C, to raise up the die 210. In FIG. 2D, the assembly is packaged, such as by molding.

FIGS. 3A-E shows a further embodiment 300 of FCOL assembly in accordance with embodiments of the invention. In FIG. 3A, an adhesive material 302 is placed on a lead frame 304. FIG. 3A1 shows an exemplary top view of the lead frame 304. The lead frame 304 has through holes 306 for solder balls 308 to provide electrical connections.

As shown in FIG. 3B, a die 310 is attached to the adhesive material 302 and as shown in FIG. 3C, solder balls 308 are then placed in the through holes 306 in the lead frame where I/O connections are desired. The assembly is then flipped and as shown in FIG. 3D, the solder is reflowed to provide a solid connection between the die 310 and the lead frame 304. As shown in FIG. 3E, the assembly is molded and I/O pins attached to the lead frame.

In the above embodiment, the inventive lead frame configuration enables the use of conventional solder ball attachment processes. When the die is directly attached and the adhesive is cured, sufficient planarity between the die and leadframe can be achieved by using elastomer attachment or by using non-conductive adhesive or epoxy with pre-determined non-conductive filler size, for example. FIG. 3B1 shows an exemplary detailed view of non-conductive filler elements 311, shown having a spherical geometry of desired diameter, disposed between the leadframe 304 and the die 310. The filler elements 311 can be surrounded by non-conductive adhesive or epoxy 313, for example.

Figure 4:
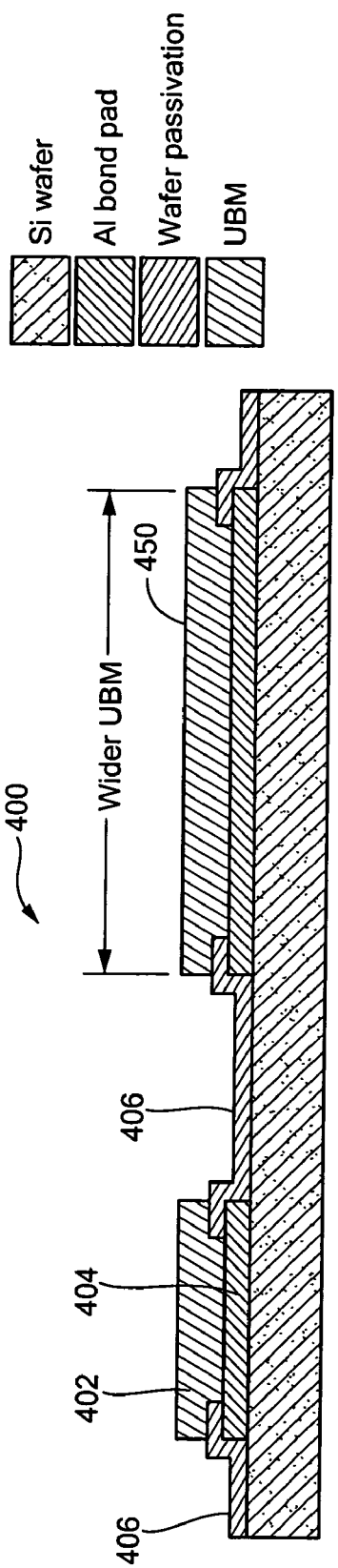
FIG. 4 is a schematic depiction of a die having an under bump metallization structure.

FIG. 4 shows an exemplary under bump metallization (UBM) configuration 400 for direct contact at an active bond pad area of the die (no redistribution layer (RDL)). A silicon die 401 includes a UBM structure 402 located on an active bond pad 404, for example. A wafer passivation layer 406 covers the die exclusive of the UBM areas.

It is understood that the UBM structure can have a width configured to meet the needs of a particular application. For example, a second UBM structure 450 can be wider than the first UBM structure 402 to handle greater current levels, for example.

In general, the UBM structure 402, 450 can have a variety of configurations. Exemplary suitable UBM configurations are set forth below in Table 1. As shown below, the UBM structure will depend upon the material of the bump.

TABLE 1

Known UBMs for Gold, Copper, Aluminum, Solder and Nickel Bumps

| Bump | UBM | Process |
|------|-----|---------|
| Gold | Cr—Cu | Electroplating |
|      | Ti—Pd | Electroplating |
|      | Ti—W  | Electroplating |

TABLE 1-continued

Known UBMs for Gold, Copper, Aluminum, Solder and Nickel Bumps

| Bump | UBM | Process |
|---|---|---|
| | Ti—Pt | Electroplating |
| Copper | Cr—Cu | Electroplating |
| | Al—Ni | Electroplating |
| Aluminum | Ti | Evaporating |
| | Cr | Evaporating |
| Solder | Cr—Cu—Au | Evaporating/Printing |
| | Ni—Cu | Electroplating/Printing |
| | Ti—Cu | Electroplating/Printing |
| | TiW—Cu | Electroplating/Printing |
| | Ni—Au | Electroless/Printing |
| | Al—NiV—Cu | Sputtering/Printing |
| Nickel | Ni | Electroless Ni/Au |

Figure 5:
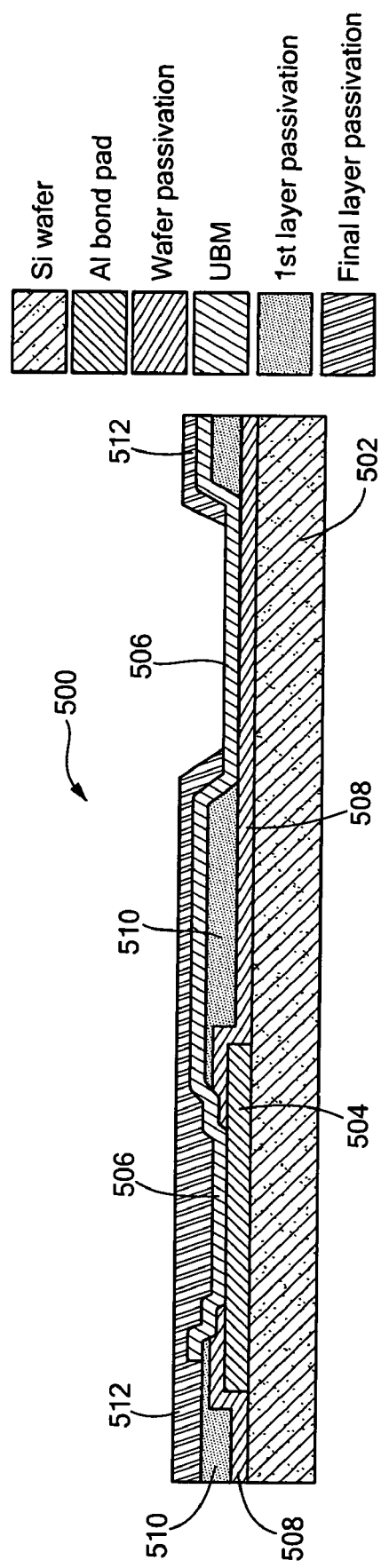
FIG. 5 is a schematic depiction of die having an under bump metallization structure and an RDL.

FIG. 5 shows an exemplary configuration 500 including a die 502 having an RDL structure to distribute die I/Os as desired. The configuration 500 includes an Aluminum bond pad 504 on which a UBM structure 506 is located. A wafer passivation layer 508 covers the die except for the UBM areas. Between the wafer passivation layer 508 and the UBM structure 506 is located a first layer passivation 510 with a final passivation layer 512 on top of the UBM structure 506. The UBM layer 506 enables an active area (I/O) to be distributed to a desired location for coupling to a leadframe.

Embodiments of the invention provide interconnection between the die and a leadframe while eliminating the need for wafer bumping. This arrangement provides sufficient contact between a die and a leadframe by increasing the UBM and bump size to suitable dimensions. The inventive techniques are applicable for both leaded and ball grid array packages. Larger UBMs can be dedicated as I/O to carry higher currents. Larger UBMs can be assigned as thermal bumps in direct contact with thermal pads or leads.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A method, comprising:
placing a conductive material on a protrusion from a leadframe to form a first assembly;
forming a non-conductive mask about the protrusion;
placing a die on the first assembly, the die having an active area;
reflowing the conductive material to raise up the die to form a second assembly such that a connection extends from the die active area, through the conductive material, to the protrusion; and
surrounding the die with a material to form a third assembly.

2. The method according to claim 1, further including forming a depression in the mask.

3. The method according to claim 2, wherein the conductive material is placed in the depression, wherein the protrusion extends into the depression.

4. The method according to claim 3, wherein the protrusion is a pad pillar.

5. The method according to claim 1, further including filling gaps about the reflowed conductive material with an epoxy compound.

6. The method according to claim 1, further including forming an under bump metallization structure at the active area of the die.

7. The method according to claim 1, wherein the die rests on the conductive material prior to reflow of the conductive material.

8. The method according to claim 1, further including forming a redistribution layer on the die to form a connection point for the active area.

9. A semiconductor package formed according to claim 1.

10. A method, comprising:
placing a mask on a lead frame having a protrusion, the mask having a depression into which the protrusion extends;
placing solder paste in the depression to form a first assembly;
placing a die on the first assembly, the die having an active area;
reflowing the solder paste to raise up the die; and
securing the die to the leadframe such that the solder forms a connection between the protrusion and the active area of the die.

11. The method according to claim 10, further including preparing the active area of the die to provide an under bump metallization structure.

12. The method according to claim 10, further including molding a package to hold the wafer and leadframe.

13. The method according to claim 10, further including filling gaps adjacent the reflowed solder with epoxy.

14. The method according to claim 10, further including forming the protrusion from the leadframe.

15. The method according to claim 10, wherein the solder paste extends above the depression.

16. An article, comprising:
a leadframe having a protrusion;
a non-conductive mask having a depression into which the protrusion extends;
a conductive material reflowed to the protrusion;
a die having an active area coupled to the protrusion by the reflowed solder;
a material about the conductive material to secure the die to the leadframe; and
an under bump metallization structure on active area of the die.

17. The article according to claim 16, wherein the conductive material includes solder paste that raised up the die when reflowed.

18. A device, comprising:
a semiconductor package, including:
a leadframe having a protrusion;
a non-conductive mask having a depression into which the protrusion extends;
a conductive material reflowed to the protrusion;
a die having an active area coupled to the protrusion by the reflowed solder;
a material about the conductive material to secure the die to the leadframe; and
an under bump metallization structure on active area of the die.

19. The device according to claim 18, wherein the semiconductor package does not have a wafer bump.

* * * * *

UNITED STATES PATENT AND TRADEMARK OFFICE
CERTIFICATE OF CORRECTION

PATENT NO. : 7,361,531 B2  
APPLICATION NO. : 11/265801  
DATED : April 22, 2008  
INVENTOR(S) : Sharma et al.

Page 1 of 1

It is certified that error appears in the above-identified patent and that said Letters Patent is hereby corrected as shown below:

Col. 2, line 5, delete "including" and replace with -- include --.

Col. 3, line 30, delete "in art" and replace with -- in the art --.

Col. 3, line 66, delete "a" and replace with -- that a --.

Col. 4, line 5, delete "shows" and replace with -- show --.

Col. 4, line 17, delete "shows" and replace with -- show --.

Col. 4, line 30, delete "attached" and replace with -- are attached --.

Col. 4, line 54, delete "structure" and replace with -- structures --.

Signed and Sealed this

Twenty-sixth Day of August, 2008

JON W. DUDAS  
*Director of the United States Patent and Trademark Office*